US006288477B1

(12) United States Patent
Gilmore et al.

(10) Patent No.: US 6,288,477 B1
(45) Date of Patent: Sep. 11, 2001

(54) COMPOSITE ULTRASONIC TRANSDUCER ARRAY OPERATING IN THE $K_{31}$ MODE

(75) Inventors: James Michael Gilmore, Bothell; John D. Fraser, Woodinville, both of WA (US)

(73) Assignee: ATL Ultrasound, Bothell, WA (US)

(*) Notice: Subject to any disclaimer, the term of this patent is extended or adjusted under 35 U.S.C. 154(b) by 0 days.

(21) Appl. No.: 09/457,196

(22) Filed: Dec. 3, 1999

(51) Int. Cl.[7] .......... H01L 41/04
(52) U.S. Cl. .......... 310/334
(58) Field of Search .......... 310/334, 322

(56) References Cited

U.S. PATENT DOCUMENTS

| | | | | |
|---|---|---|---|---|
| 3,964,014 | * | 6/1976 | Tehon | 310/322 |
| 4,096,756 | * | 6/1978 | Alphonse | 73/609 |
| 4,245,172 | * | 1/1981 | Shirley | 310/332 |
| 4,398,325 | | 8/1983 | Piaget et al. . | |
| 4,554,558 | * | 11/1985 | Beaudet et al. | 347/75 |
| 4,587,528 | * | 5/1986 | Beaudet | 347/75 |
| 4,667,337 | * | 5/1987 | Fletcher | 365/227 |
| 4,864,179 | * | 9/1989 | Lapetina et al. | 310/337 |
| 4,914,565 | * | 4/1990 | Schnoeller et al. | 367/164 |
| 5,065,068 | | 11/1991 | Oakley . | |
| 5,164,920 | | 11/1992 | Bast et al. . | |
| 5,187,403 | * | 2/1993 | Larson, III | 310/334 |
| 5,254,900 | * | 10/1993 | Magori et al. | 310/334 |
| 5,311,095 | | 5/1994 | Smith et al. . | |
| 5,329,496 | | 7/1994 | Smith . | |
| 5,493,541 | | 2/1996 | Snyder . | |
| 5,539,965 | | 7/1996 | Safari et al. . | |
| 5,548,564 | | 8/1996 | Smith . | |
| 5,553,035 | | 9/1996 | Seyed-Bolorforosh et al. . | |
| 5,625,149 | | 4/1997 | Gururaja et al. . | |
| 5,704,105 | | 1/1998 | Venkataramani et al. . | |
| 5,758,396 | * | 6/1998 | Jeon et al. | 29/25.35 |
| 5,796,207 | | 8/1998 | Safari et al. . | |
| 6,095,978 | | 8/2000 | Takeuchi . | |

OTHER PUBLICATIONS

Mills et al., "Combining Multi–Layers and Composites to Increase SNR for Medical Ultrasound Transducers," at pp. 1509–1512, 1996 IEEE Ultrasonics Symposium.

* cited by examiner

*Primary Examiner*—Nestor Ramirez
*Assistant Examiner*—Peter Medley
(74) *Attorney, Agent, or Firm*—W. Brinton Yorks, Jr.

(57) ABSTRACT

An ultrasonic transducer array element operating in the $k_{31}$ mode is formed by two piezoelectric subelements joined to form a 2—2 composite by a conductive filler material. An energizing potential is applied to the conductive filler material, and a return potential is applied to the outer opposing faces of the subelements. Preferably the conductive filler material comprises a conductive epoxy. Arrays of such elements in one and two dimensions are formed with the conductive epoxy in alternating kerfs in a row being connected to the opposing polarities of an energizing potential.

46 Claims, 3 Drawing Sheets

COMPOSITE ULTRASONIC TRANSDUCER ARRAY OPERATING IN THE $K_{31}$ MODE

This invention relates to ultrasonic diagnostic transducer arrays and, in particular, to ultrasonic transducer arrays operating in the $k_{31}$ mode.

Ultrasonic transducer arrays are used as the transmitting and receiving elements in medical ultrasonic imaging probes or scanheads. Such arrays are formed by cutting or dicing a plate of piezoelectric material into individual transducer elements forming an array. The elements of the array are coupled to a beamformer which, through timed excitation and reception of signals from the array elements, causes the array to transmit steered and focused beams of ultrasonic energy and receives coherent echo information from along those beams. The piezoelectric material may comprise a polymer or a ceramic with ceramic material such as PZT being preferred for many medical imaging applications.

In order for the transducer array to exhibit good efficiency in response to an excitation signal and good sensitivity to low level echo signals, it is desirable to closely match the electrical impedance of the array elements to the electrical circuitry to which they are connected. Such electrical circuitry generally comprises cables and passive and active electronic components. However the transducer elements are generally designed to exhibit certain desired performance characteristics such as frequency of operation, aperture size, and interelement pitch. These criteria in turn define certain dimensions of the transducer elements which in large measure establish the electrical impedance of the elements for a given piezoelectric material with certain dielectric properties. When a relatively high frequency of operation is desired or elements are to be produced in a 1.5D or 2d array, the dimensions of the array elements become relatively small, which in turn results in relatively high electrical impedances for the transducer elements, often in the range of hundreds or thousands of ohms. Cable impedances are generally in the range of 20–300Ω and the impedance of electrical circuitry connected to the transducer elements can be significantly less than 100Ω. Hence, an undesirable impedance mismatch between the transducer elements and the cable or circuitry often arises.

Numerous approaches have been taken to reduce impedance mismatches by reducing the impedance of the array elements. One is by developing piezoelectric material with an inherent low impedance. But these materials are largely experimental at the present time and are often inferior to standard piezoelectric ceramics with respect to parameters such as electromechanical coupling or temperature dependence. Another approach is to form a transducer element as a stack of thin layers of ceramic which are electrically connected in parallel. Since each thin layer exhibits a relatively low impedance and the stack of thin layers exhibits a larger effective area compared to a full thickness of the piezoelectric material, the electrical impedance of the multilayer ceramic will be relatively low. However, fabricating such thin multilayer transducers in commercial quantities and at commercially reasonable costs has not yet been satisfactorily accomplished. Furthermore, the ability to provide electrical connections to the multiple layers of such a transducer, particularly for 1.5D and 2D arrays, can be very limited. Hence a need for an efficient, low cost, low impedance array transducer continues to exist.

In accordance with the principles of the present invention, a low impedance transducer array is provided by operating the array elements in the $k_{31}$ mode. In this mode of operation the element electrical impedance is reduced by the favorable height to thickness ratio of the transducer elements. Electrical connections are easily made to the sides instead of the top and bottom of the transducer elements. In accordance with one aspect of the present invention the elements are constructed from two subelements with an electrode of one polarity applied to the opposing sides of the subelements an electrode of another polarity applied to the nonopposing sides of the subelements. In accordance with another aspect of the present invention a conductive filler is used to form the electrodes of the elements. In a preferred embodiment a conductive material provides both the composite filler structure and the electrode structure of the array.

Figure 4A:
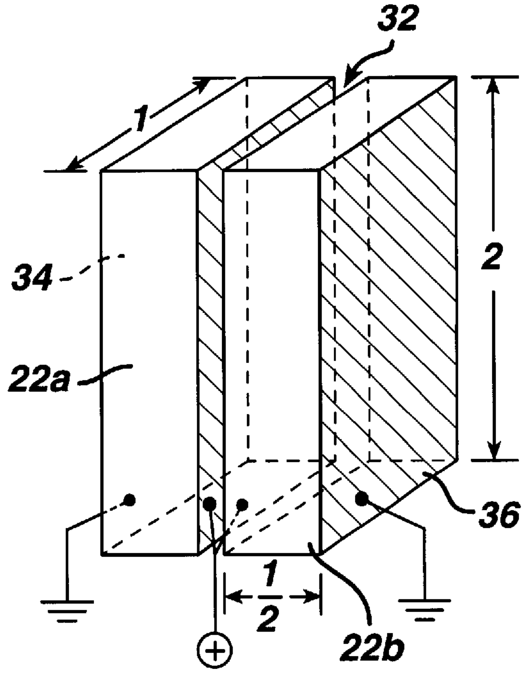
Figure 4B:
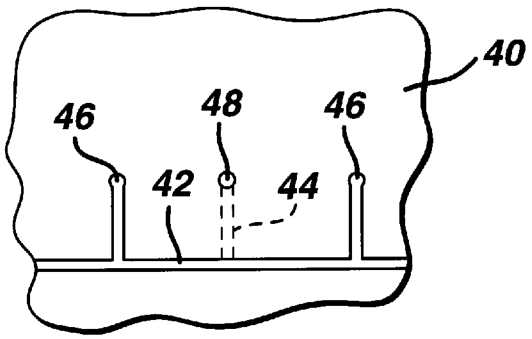

FIG. 4*a* illustrates a transducer element which is subdiced and operated in the $k_{31}$ mode in accordance with the principles of the present invention;

FIG. 4*b* illustrates a printed circuit pattern suitable for use with the transducer element of FIG. 5*a;*

Figure 5:
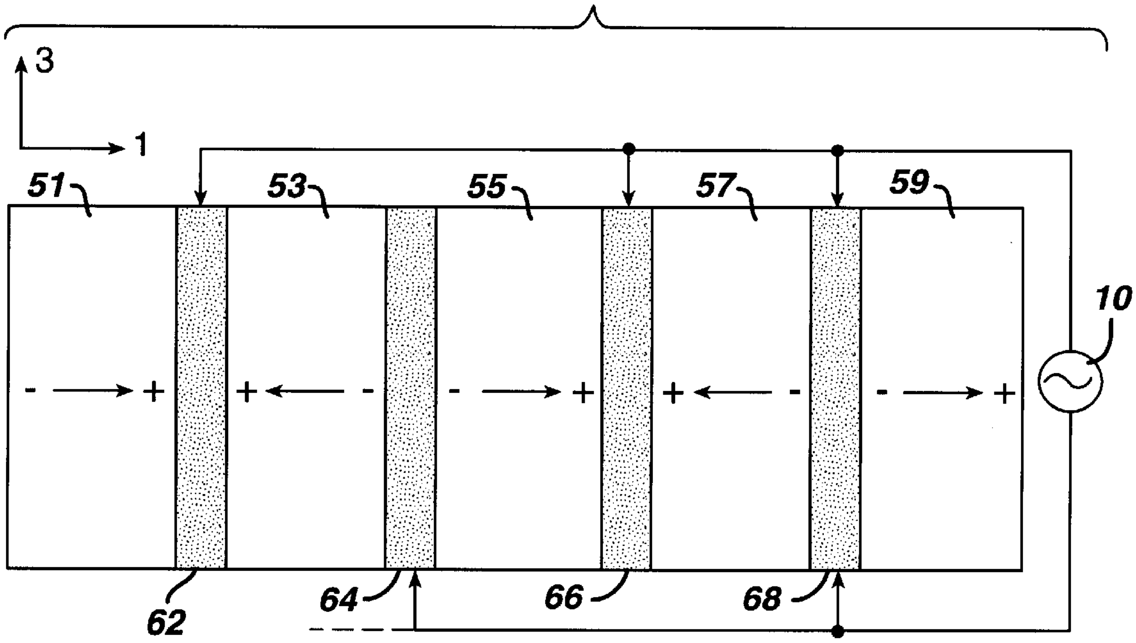
Figure 6:
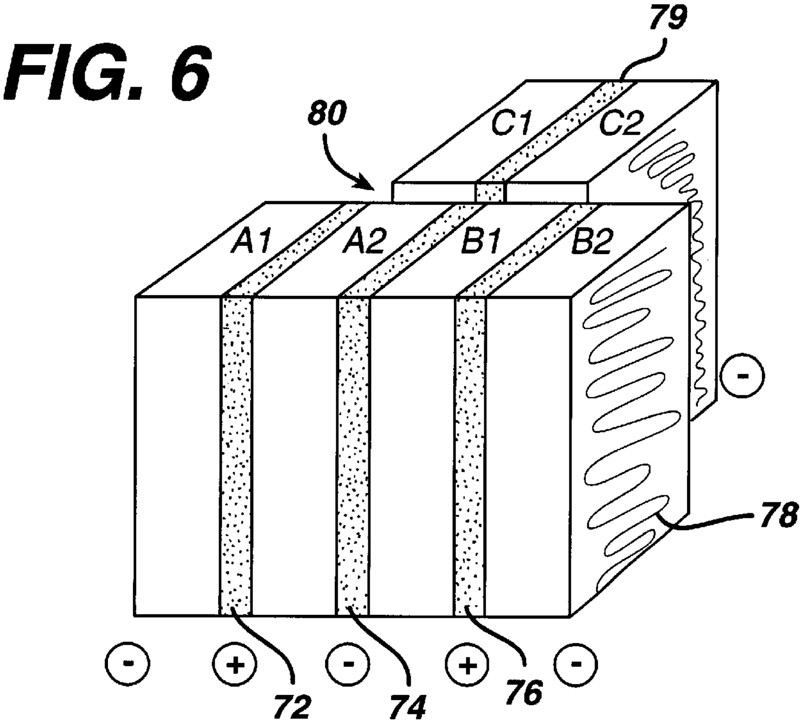

FIG. 5 illustrates a composite piezoelectric transducer structure operated in the $k_{31}$ mode in accordance with the principles of the present invention; and FIG. 6 illustrates a 2D transducer array constructed in accordance with the principles of the present invention.

Figure 1:
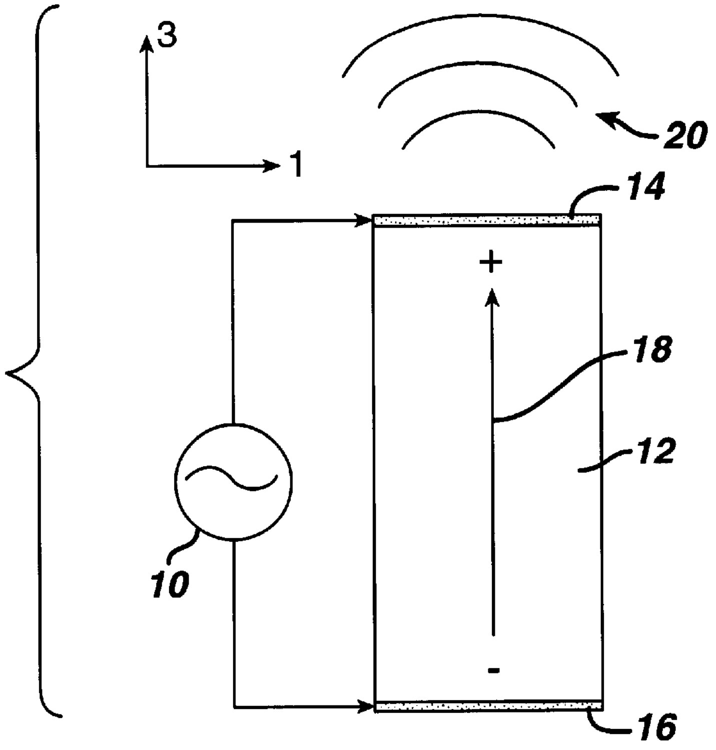
FIG. 1 PRIOR ART
FIG. 1 illustrates a piezoelectric transducer element as operated in accordance with prior art techniques.

Referring first to FIG. 1, a side view of a transducer array element 12 operated as known in the prior art is shown. The body of the piezoelectric array element 12 is shown to have a greater height dimension than width dimension to cause the element to preferentially vibrate in a desired mode, for example vertically in the drawing so that transmit waves will emanate outward from the top of the element. The piezoelectric body has an electrode 14 plated to the top of the element and an electrode 16 plated to the bottom of the element. The transducer element is excited into piezoelectric oscillation by an electrical potential 10 which is applied to the top and bottom electrodes. The piezoelectric material is poled from bottom to top as indicated by the arrow 18. When the transducer element is excited by the application of a driving potential, the piezoelectric oscillation causes an ultrasonic wave 20 to be transmitted from the top of the transducer element. The directional 3 and 1 arrows adjacent to the transducer element indicate standard reference directions. Since the transducer element is poled and driven in the 3 direction and transmits a wave in the 3 direction, the mode of operation of the transducer element may be described as the $k_{33}$ mode of operation.

Figure 2:
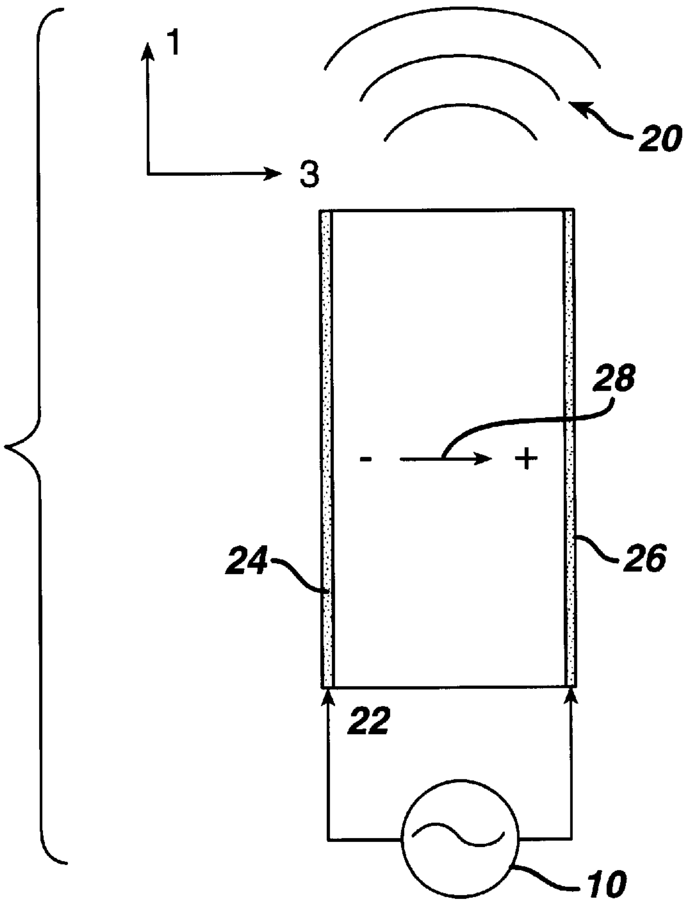
FIG. 2 illustrates a piezoelectric transducer element operated in the $k_{31}$ mode.

FIG. 2 illustrates a transducer element operated in the $k_{31}$ mode of operation. In this mode the electrodes 24 and 26 are formed on the lateral sides of the piezoelectric body 22 instead of the top and bottom. The piezoelectric material is poled horizontally in the three direction as indicated by the arrow 28. When the electrical potential 10 is applied to the electrodes, the transducer is driven in the 3 direction, which in this drawing is the horizontal direction. The poling and excitation direction 3 is orthogonal to the intended 1 direction of ultrasonic transmission. The applied excitation potential causes a strain in the piezoelectric material in the 3 direction and also results in a strain in the 1 direction through what is known as the Poisson effect and direct piezoelectric cross-coupling. The 1 direction strain causes an ultrasonic wave to be emitted in the 1 direction. A pressure wave is also produced in the 3 direction but, by virtue of the different transducer dimensions in the 1 and 3 directions, the pressure waves are in different frequency bands. This means that the dimensions of the transducer element are chosen such that the 1 direction wave is at the desired resonant frequency and the lateral waves in the 3 direction are outside the frequency band of interest. There is an inherent electromechanical coupling inefficiency in driving a transducer element in the 3 direction to emit ultrasound in the orthogonal direction. However, as explained below, the lower impedance of the $k_{31}$ operated elements together with the improved access to electrical connections are benefits which offset this inefficiency.

Figure 3:
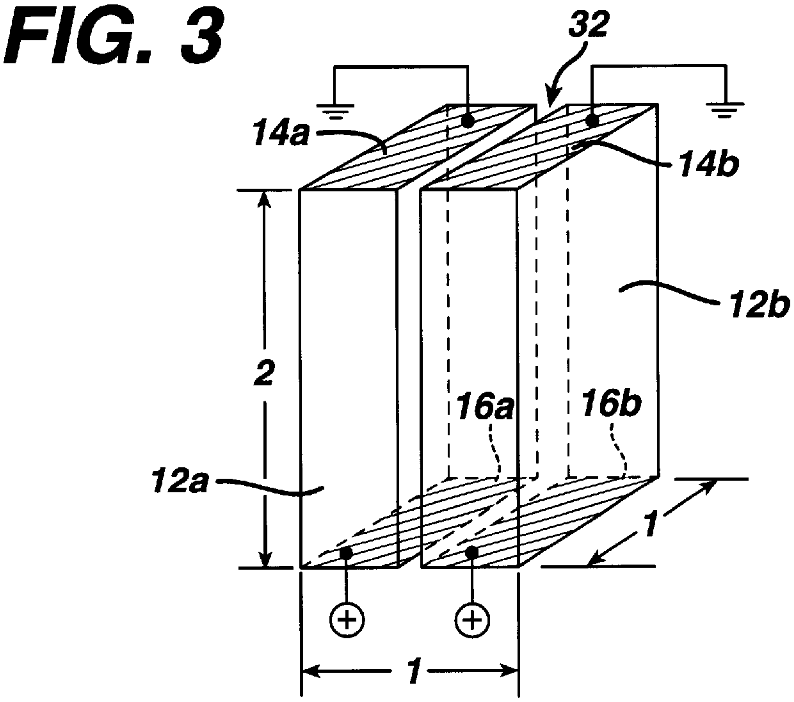
FIG. 3 illustrates a transducer element which is subdiced to comprise two subelements.

FIG. 3 illustrates another transducer element operated in the conventional $k_{33}$ mode. This transducer element is formed by two subdiced subelements 12*a* and 12*b* which have been formed by a subdicing kerf cut 32 down the middle of the element. The element in this example is seen to be two units high by one unit wide by one unit deep. The subelements are excited by the application of a positive energizing potential to the bottom electrodes 16*a* and 16*b*. The top electrodes 14*a* and 14*b* are coupled to ground. The top, grounded end of the transducer element typically opposes the patient separated by matching layer, and a lens cover. The energizing potential is typically applied through a damping layer attached to the bottom of the element.

The transducer element of FIG. 3 has an impedance which is determined by the dielectric properties of the piezoelectric material and its dimensions, both of which affect the capacitance of the element. Since the impedance is an inverse function of the capacitance, it is desirable for the capacitance to be as high as possible. The capacitance is determined by the expression $C=\epsilon A/d$ where $\epsilon$ is the dielectric constant of the piezoelectric material, A is the electrode area and d is the distance between the electrodes. In FIG. 3 each electrode is 1×1, giving the electrodes the reference area of one. The electrode separation is 2, giving the transducer element a reference capacitance of one-half.

FIG. 4*a* illustrates a subdiced transducer element operated in the $k_3l$ mode in accordance with the present invention. The transducer element has the same height, width and depth dimensions as the transducer element of the previous drawing figure. In this embodiment electrodes are formed on the outer nonopposing faces 34 and 36 of the two subelements *22a,22b,* as well as on the adjacent, opposing faces of the subelements in the subdicing kerf cut 32. Operation in the $k_{31}$ mode is provided by applying a positive potential to the two electrodes on the opposing faces in the kerf cut 32 and grounding the electrodes on the nonopposing faces 34 and 36 as shown. It is thus seen that each electrode has a dimension of 1×2, and thus a reference area of two. Furthermore, the two subelements are electrically in parallel by reason of the manner in which the energizing and grounding potentials are attached. Thus, the transducer element as a whole has a reference area of four. The distance between the oppositely poled electrodes is the distance from the center kerf cut to the outer sides 34 or 36, which is a reference distance of one-half. When these dimensions are used in the capacitance equation, it is seen that $C=\epsilon A/d=A\epsilon/½=8\epsilon$, which is sixteen times the capacitance of the FIG. 3 transducer element. Thus, the transducer element of FIG. 4*a* will nominally exhibit one-sixteenth the impedance of the transducer element of FIG. 3, an advantage which greatly compensates for the electromechanical coupling inefficiency of the $k_{31}$, transducer.

The embodiment of FIG. 4*a,* with its electrodes all extending down the sides to the bottom of the transducer element, affords an ease in electrical attachment, since all electrodes can be accessed from the bottom of the transducer element. FIG. 4*b* is a plan view of a portion of the surface of a printed circuit board 40. On the top surface of the board 40 is a conductive trace 42 which periodically has connecting pads 46. These connecting pads are separated by the width of the transducer element of FIG. 4*a* so that when the transducer element is placed on the top surface of the board 40 the electrodes of outer sides 34 and 36 are aligned with connecting pads 46 and electrically connected thereto to provide grounding of those two electrodes. A parallel conductive trace 44 on the bottom of the printed circuit board 40 periodically extends through plated-through holes to form connecting pads 48. The illustrated connecting pad 48 is aligned with and electrically connected to the two electrodes in the kerf cut 32 of the transducer element, thereby providing the positive energizing potential to those two electrodes. Thus, all electrical connections can be made to the electrodes of the transducer element of FIG. 4*a* from a PCB or cable located on the bottom of the transducer element, a considerable advantage when a plurality of the transducer elements are arranged in a 1.5D or 2D array. A preferred manner of making connections to the electrodes is by flex circuit embedded in acoustic backing material as described in European patent publication EP 0 872 285.

In accordance with another aspect of the present invention, the electrodes on the subdiced element faces inside the kerf cut 32 are made of a conductive filler material such as a conductive adhesive. Suitable conductive epoxies for this purpose are available from Chomerics and Eccobond. It is not necessary to carefully coat the separate faces inside the kerf cut with the conductive epoxy; rather, the kerf cut is simply filled with conductive epoxy through a any of a variety of processes such as vacuum deposition or squeegeeing. This effectively forms the transducer element as a composite, a matrix of piezoelectric material, the two subelements 22*a* and 22*b,* unified by a filler, the conductive epoxy. The transducer element is thus a 2—2 composite.

This concept of a conductive filler electrode material may be expanded to form an array of elements in an easy to manufacture unit. A block of piezoelectric material, which may be a unitary piezoelectric material or a composite, is diced into separate subelements 51, 53, 55, 57, 59 as shown in the side view of FIG. 5. The kerf cuts are filled with a conductive epoxy as shown at 62, 64, 66 and 68. The separate subelements are alternately poled as shown by the poling arrows. An energizing potential is applied to the alternately filled kerf cuts as shown in the drawing. In this embodiment the subelements 51 and 53 form a single transducer element which is excited by the potential applied to the conductive epoxy in kerf cut 62. An electrical return for that element is provided by the conductive epoxy electrode in kerf cut 64 and by the conductive epoxy on the left side of element 51 (not shown). A second transducer element is formed by subelements 55 and 57. This element is excited by the potential applied to the conductive epoxy in kerf cut 66 with electrical returns provided by the conductive epoxy in kerf cuts 64 and 68. It is seen that the return electrode material is shared with the neighboring elements on either side of the transducer element formed by subelements 55 and 57. Additional transducer elements are formed on either side of these two elements in a similar manner.

The subelements of FIG. 5 can also be excited in unison by one energizing potential and operated as a single composite element. The alternating poling and electrical connection sequences shown in the drawing cause all the piezoelectric subelements to vibrate in phase and a pressure wave would radiate from the top and bottom of the surfaces of the composite. The electrical impedance of the unit is determined by the pitch and kerf width of the composite structure.

FIG. 6 illustrates a 2D transducer array constructed in accordance with the principles of the present invention. This transducer array is fabricated by dicing a piezoelectric plate with a plurality of kerfs in two orthogonal directions, thereby forming a plurality of subelements such as those shown in the drawing as A1, A2, B1, B2, C1 and C2. The kerf cuts are then filled with a conductive epoxy. The conductive epoxy is then removed from the kerf cuts in one of the orthogonal directions, which can be done by redicing the kerf cuts, leaving insulating, air-filled kerf cuts. These kerf cuts can be filled with an electrically insulating material if desired. An alternate fabrication technique is to dice the piezoelectric plate in one direction, fill the kerf cuts with conductive epoxy, then dice the structure in the orthogonal direction to form the electrically insulating kerf cuts. One of the insulating kerf cuts 80 is shown in FIG. 6, separating the row of elements containing subelements A1, A2, B1 and B2 from the row containing subelements C1 and C2.

The conductive epoxy electrodes are connected to alternating conductive traces of a printed circuit board, flex circuit, or cable as shown by the alternating polarity circles in the drawing. An effective way to apply signals to the electrodes is through flex circuit embedded in the backing of the array as described FIG. 1 of European patent publication EP 0 872 285 A2, the contents of which is incorporated herein by reference. This causes subelements A1 and A2 to form a single composite transducer element which is energized by the conductive epoxy electrode 72 in contact with the opposing faces of the subelements, and with electrical returns on the outer, nonopposing faces of the subelements including conductive epoxy electrode 74. Likewise subelements B1 and B2 form a single composite transducer element which is energized by the conductive epoxy electrode 76 on the opposing subelement faces with electrical returns on the nonopposing side faces of subelements B1 and B2 including conductive epoxy electrodes 74 and 78.

Subelements C1 and C2 form another composite transducer element in the row behind the A1-A2 and B1-B2 elements. The C1-C2 transducer element is excited by applying an energizing potential to the conductive epoxy electrode 79 in the kerf cut between the two subelements, with electrical returns provided by the conductive epoxy electrodes on the outer, nonopposing side faces of subelements C1 and C2. While the C1-C2 subelements are not aligned with the A1-A2 subelements or the B1-B2 subelements, in the illustrated embodiment the C1-C2 subelements are aligned with the A2 and B1 subelements. Thus, the transducer elements exhibit a staggered alignment across the 2D array. It is seen that this alignment causes the conductive epoxy electrode 78, the energizing electrode for transducer element C1-C2, to be in alignment with the return electrode 74 of the adjacent row. Similarly, the return electrodes on either side of the C1-C2 transducer element are in line with energizing electrodes 72 and 76 of the adjacent row of transducer elements. These electrodes in the respective rows are electrically insulated from each other by the kerf cut 80 between the rows.

What is claimed is:

1. A $k_{31}$ transducer array for diagnosing a mammalian subject comprising:

a plurality of piezoelectric elements each having top and bottom surfaces intersecting the 1 direction, and orthogonal lateral surfaces intersecting the 3 direction; and two electrodes located on said lateral surfaces of each of said piezoelectric elements and both electrodes being accessible from the area below said bottom surface for the application of two polarities of an energizing potential, wherein said elements are energized in the 3 direction to preferentially radiate an ultrasonic wave in the 1 direction.

2. The $k_{31}$ transducer array of claim 1, further comprising a matching layer located on said top surface, wherein said elements are poled in the 3 direction and radiate an ultrasonic wave in the 1 direction.

3. The $k_{31}$ transducer array of claim 1, wherein neither of said two electrodes are accessed for the application of an energizing potential from the area above said top surface.

4. A $k_{31}$ transducer array comprising:

a plurality of piezoelectric elements each having top and bottom surfaces intersecting the 1 direction, and orthogonal lateral surfaces intersecting the 3 direction; and two electrodes located on said lateral surfaces of each of said piezoelectric elements and both electrodes being accessible from the area below said bottom surface for the application of two polarities of an energizing potential, wherein said elements are energized in the 3 direction to radiate an ultrasonic wave in the 1 direction, wherein each piezoelectric element comprises two subelements separated by a kerf extending in the 1 direction in which lateral surfaces of said subelements oppose each other;

two electrodes are located on said lateral surfaces in said kerf to which one polarity of an energizing potential is applied; and two electrodes are located on two other lateral surfaces of said subelements to which another polarity of an energizing potential is applied.

5. The $k_{31}$ transducer array of claim 4, wherein said four subelement surfaces on which said four electrodes are located all intersect the 3 direction.

6. The $k_{31}$ transducer array of claim 5, wherein said subelements of a piezoelectric element are poled in the 3 direction in opposite senses.

7. The $k_{31}$ transducer array of claim 4, wherein each subelement of a piezoelectric element exhibits a capacitance which is in parallel with the capacitance of the other subelement.

8. The $k_{31}$ transducer array of claim 4, wherein each of said two electrodes located on two other lateral surfaces of said subelements of a piezoelectric element are electrically connected to an electrode of an adjacent piezoelectric element.

9. A $k_{31}$ transducer array comprising:

a plurality of piezoelectric elements which are energized in the 3 direction for ultrasonic transmission in the 1 direction, wherein each piezoelectric element includes two subelements separated by a kerf extending in the 1 direction, said subelements having faces opposing each other in said kerf and each subelement having another face extending in the 1 direction, and wherein each piezoelectric element includes a conductive filler located in said kerf and providing a first electrode of said element for a first polarity energizing potential, and second and third electrodes located respectively on said another face of each subelement for a second polarity energizing potential.

10. The $k_{31}$ transducer array of claim 9, wherein said second and third electrodes further comprise electrodes for adjacent transducer elements of said array.

11. The $k_{31}$ transducer array of claim 10, wherein said second and third electrodes each comprise a conductive filler located in a kerf between adjacent transducer elements.

12. The $k_{31}$ transducer array of claim 9, wherein said second and third electrodes are electrically connected to a common electrical potential.

13. The $k_{31}$ transducer array of claim 12, wherein said common electrical potential is a reference potential.

14. The $k_{31}$ transducer array of claim 9, wherein one subelement is poled in a direction from said first electrode to said second electrode, and the other subelement is poled in a direction from said first electrode to said third electrode.

15. The $k_{31}$ transducer array of claim 14, wherein said poling directions are said 3 direction.

16. The two dimensional $k_{31}$ transducer array of claim 14, wherein said electrodes are formed by a conductive filler material located in said kerf cuts.

17. The two dimensional $k_{31}$ transducer array of claim 16, wherein said conductive filler material comprises a conductive epoxy.

18. The $k_{31}$ transducer array of claim 9, wherein said array has an emitting surface from which ultrasonic waves are transmitted, and wherein each of said electrodes is electrically connected to a source of energizing potential at the surface of said array opposite said emitting surface.

19. A $k_{31}$ composite transducer array comprising:

a first row of piezoelectric subelements separated by kerfs which contain a conductive filler which joins adjacent elements and provides a common electrical connection to the joined elements, wherein each element of said array comprises a plurality of adjacent subelements.

20. The $k_{31}$ composite transducer array of claim 19, wherein said subelements transmit ultrasonic waves in the 1 direction, said kerfs extend in the 1 direction, and said subelements are energized by a potential applied in the 3 direction.

21. The $k_{31}$ composite transducer array of claim 19, wherein the conductive filler of consecutive kerfs in the 3 direction comprise alternate polarity electrodes of said array.

22. The $k_{31}$ composite transducer array of claim 21, wherein the conductive filler of alternate ones of said consecutive kerfs comprise reference potential electrodes, and the conductive filler of the remaining ones of said consecutive kerfs comprise energizing potential electrodes for respective transducer elements.

23. The $k_{31}$ composite transducer array of claim 22, wherein electrical connections are made to said electrodes by conductive traces of a printed circuit.

24. The $k_{31}$ composite transducer array of claim 23, wherein the polarity of adjacent traces of said printed circuit alternates.

25. The $k_{31}$ composite transducer array of claim 23, wherein said electrical connections are made to said electrodes at the surface of said array opposite the surface from which ultrasonic waves are transmitted.

26. The $k_{31}$ transducer element of claim 22, wherein electrical connections are made to said electrodes by conductors of a cable.

27. The $k_{31}$ composite transducer array of claim 26, wherein said electrical connections are made to said electrodes at the surface of said array opposite the surface from which ultrasonic waves are transmitted.

28. The $k_{31}$ composite transducer array of claim 19, wherein said subelements are poled in alternating senses in the 3 direction.

29. The $k_{31}$ composite transducer array of claim 19, wherein each element of said array comprises two subelements having a central conductive adhesive electrode to which an energizing potential is applied, and outer electrodes on opposite sides of the element to which a reference potential is applied.

30. The $k_{31}$ composite transducer array of claim 29, wherein said outer electrodes further comprise outer electrodes for adjacent transducer elements.

31. The $k_{31}$ composite transducer array of claim 19, further comprising:

a second row of piezoelectric subelements separated by kerfs which contain a conductive filler which joins adjacent elements and provides a common electrical connection to the joined elements, wherein said second row is parallel to said first row.

32. The $k_{31}$ composite transducer array of claim 31, wherein said second row is separated from the first row by an electrically insulating kerf.

33. The $k_{31}$ composite transducer array of claim 31, wherein the conductive filler of alternate ones of said consecutive kerfs of each row comprises reference potential electrodes, and the conductive filler of the remaining ones of said consecutive kerfs comprises energizing potential electrodes for respective transducer elements.

34. The $k_{31}$ composite transducer array of claim 33, wherein the reference potential electrodes of one row are aligned with the energizing potential electrodes of an adjacent row.

35. The $k_{31}$ composite transducer array of claim 34, wherein adjacent rows of piezoelectric subelements are separated by an insulating kerf.

36. The $k_{31}$ composite transducer array of claim 19, wherein each of said $k_{31}$ transducer elements comprises a 2—2 composite.

37. A $k_{31}$ transducer array which is poled in the 3 dimension to radiate an ultrasonic wave in the 1 dimension comprising:

a plurality of piezoelectric subelements separated by kerf cuts in the plane of the 1 dimension;

a plurality of electrodes formed on the faces of said piezoelectric subelements which oppose each other in said kerf cuts;

energizing potential connections coupled to the electrodes in alternating ones of said kerf cuts; and return potential connections coupled to the electrodes in the kerf cuts interleaved between said alternating kerf cuts.

38. The $k_{31}$ transducer array of claim 37, wherein said kerf cuts are filled with a filler material, whereby said $k_{31}$ transducer array comprises a 2—2 composite.

39. The $k_{31}$ transducer array of claim 38, wherein said filler material comprises a conductive adhesive material providing said conductive electrodes for said opposing faces in said kerf cuts.

40. The $k_{31}$ transducer element of claim 39, wherein said conductive adhesive material comprises a conductive epoxy material.

41. A two dimensional $k_{31}$ transducer array which is poled in the 3 dimension to radiate an ultrasonic wave in the 1 dimension comprising:

a plurality of piezoelectric subelements separated into rows of subelements by orthogonal kerf cuts in the plane of the 1 dimension;

a plurality of electrodes formed on the faces of said piezoelectric subelements of each row which oppose each other in said kerf cuts;

energizing potential connections coupled to the electrodes in alternating ones of said kerf cuts in each row; and return potential connections coupled to the electrodes in the kerf cuts interleaved between said alternating kerf cuts in each row.

42. The two dimensional $k_{31}$ transducer array of claim 41, wherein said rows are separated from each other by electrically insulating kerf cuts.

43. The two dimensional $k_{31}$ transducer array of claim 42, wherein the energizing potential electrodes of one row are aligned with the return potential electrodes of an adjacent row.

44. A $k_{31}$ transducer array for diagnosing a mammalian subject comprising:

a plurality of piezoelectric elements each having top and bottom surfaces intersecting the 1 direction, and orthogonal lateral surfaces intersecting the 3 direction;

two electrodes located on said lateral surfaces of each of said piezoelectric elements and electrically connected to the area below said bottom surface for the application of two polarities of an energizing potential;

a filler material located between individual elements of the array; and a damping layer located adjacent to the bottom surface of the elements, wherein said elements are energized in the 3 direction to radiate an ultrasonic wave in the 1 direction.

45. The $k_{31}$ transducer array of claim 44, wherein said elements are poled in the 3 direction and preferentially radiate an ultrasonic wave in the 1 direction.

46. The $k_{31}$ transducer array of claim 44, further comprising a matching layer located on said top surface.

* * * * *